(12) United States Patent
Jung et al.

(10) Patent No.: US 8,023,340 B2
(45) Date of Patent: *Sep. 20, 2011

(54) SIGNAL TRANSFER APPARATUS AND METHODS

(75) Inventors: Chulmin Jung, Boise, ID (US); Kang Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/730,994

(22) Filed: Mar. 24, 2010

(65) Prior Publication Data
US 2010/0177577 A1    Jul. 15, 2010

Related U.S. Application Data

(63) Continuation of application No. 11/854,933, filed on Sep. 13, 2007, now Pat. No. 7,701,782.

(51) Int. Cl.
*G11C 7/10*    (2006.01)
(52) U.S. Cl. .................... 365/189.05; 365/220; 365/221
(58) Field of Classification Search ............. 365/189.05, 365/220, 221
See application file for complete search history.

(56) References Cited

U.S. PATENT DOCUMENTS

| | | | |
|---|---|---|---|
| 4,953,127 A * | 8/1990 | Nagahashi et al. ...... | 365/189.05 |
| 5,383,155 A | 1/1995 | Ta | |
| 6,246,634 B1 * | 6/2001 | Nojima .................... | 365/230.08 |
| 7,050,340 B1 | 5/2006 | Ruckerbauer et al. | |
| 2009/0073777 A1 | 3/2009 | Jung | |

* cited by examiner

*Primary Examiner* — Son T Dinh
*Assistant Examiner* — Nam T Nguyen
(74) *Attorney, Agent, or Firm* — Schwegman, Lundberg & Woessner, P.A.

(57) ABSTRACT

Some embodiments include a number of nodes configured to receive a number of signals. The signals may represent information stored in a number of memory cells of a device such as a memory device. The device may include a number of transfer paths having storage elements coupled between the nodes and an output node. The transfer paths may be configured to transfer a selected signal of the signals from one of the nodes to the output node via one of the transfer paths. The transfer paths may be configured to hold a value of the selected signal in only one of the storage elements. Each of the transfer paths may include only one of the storage elements. Other embodiments including additional apparatus, systems, and methods are disclosed.

19 Claims, 12 Drawing Sheets

US 8,023,340 B2

1

SIGNAL TRANSFER APPARATUS AND METHODS

RELATED APPLICATION

This application is a continuation of U.S. application Ser. No. 11/854,933, filed Sep. 13, 2007, now U.S. Pat. No. 7,701, 782 which is incorporated herein by reference in its entirety.

FIELD

Embodiments disclosed herein relate to semiconductor devices.

BACKGROUND

Semiconductor devices, including memory, often are used in computers and electronic products, e.g., digital televisions, digital cameras, and cellular phones, to store data and other information. A memory device usually has many memory cells and associated circuit paths to transfer information to and from the memory cells.

A circuit path in a conventional memory device often has many circuit elements that operate to transfer information with the memory cells. In some cases, a large number of circuit elements in a circuit path may lead to increased circuit layout area, lower transfer speed, circuit control challenge, or a combination of thereof.

DETAILED DESCRIPTION

Figure 1:
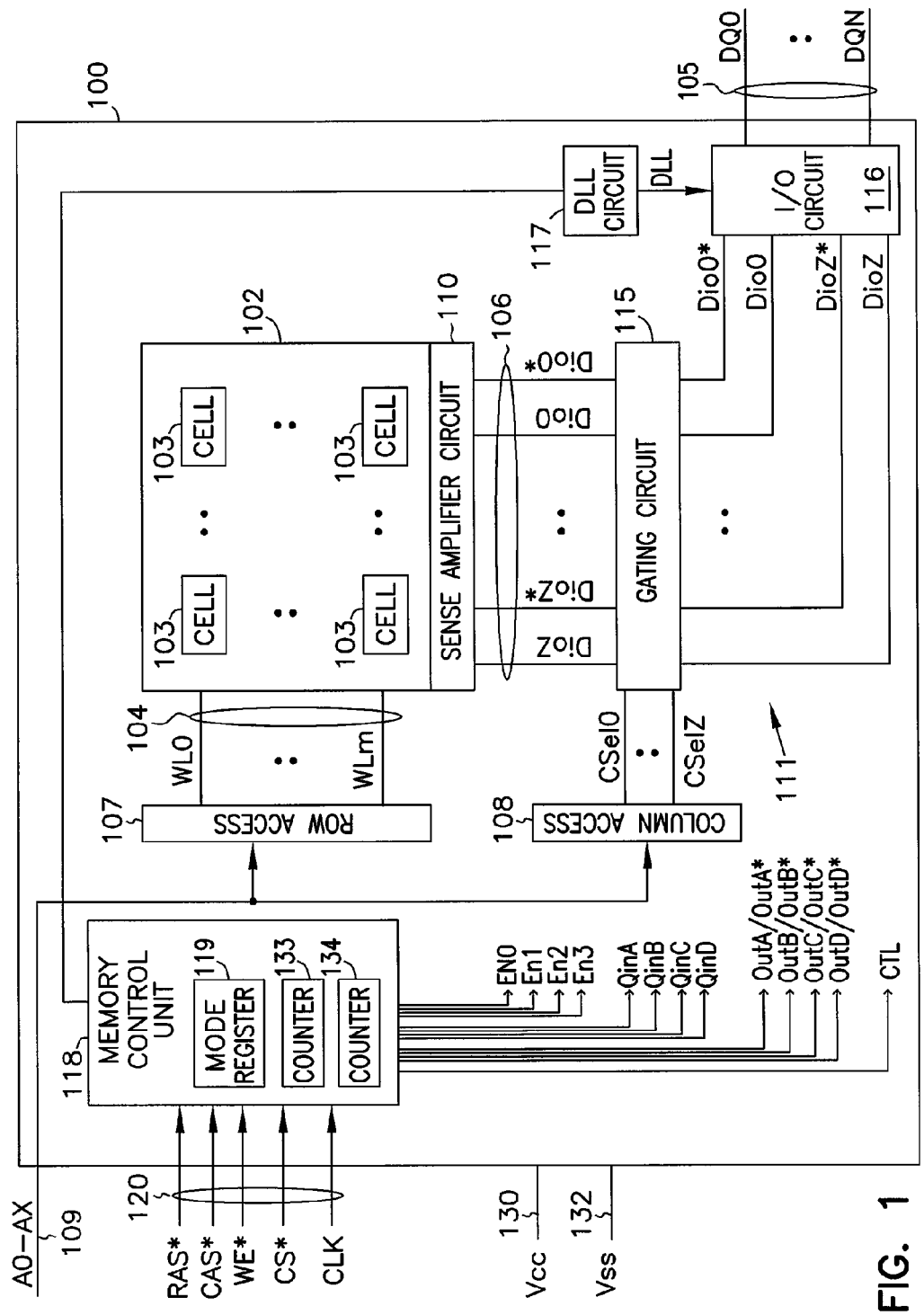
FIG. 1 shows a memory device according to an embodiment of the invention.

FIG. 1 shows a memory device 100 according to an embodiment of the invention. Memory device 100 may include a memory array 102 having memory cells 103 arranged in rows and columns along with lines 104 (e.g., wordlines having signals WL0 through WLm) and lines 106 (e.g., bit lines having signals Dio0, Dio0*, . . . , DioZ, and DioZ*). Memory device 100 may use lines 104 to access memory cells 103 and lines 106 to transfer information with memory cells 103. Row access circuit 107 and column access circuit 108 may decode address signals A0 through AX on lines 109 (e.g., address lines) to determine which memory cells 103 are to be accessed. A sense amplifier circuit 110 may operate to determine the value of information read from memory cells 103 and provide the information in the form of signals to lines 106. Sense amplifier circuit 110 may also use the signals on lines 106 to determine the value of information to be written to memory cells 103. Memory device 100 may include circuitry 111 to transfer information between memory array 102 and lines (e.g., data lines) 105. Signals DQ0 through DQN on lines 105 may represent information read from or written into memory cells 103. Lines 105 may include nodes within memory device 100 or pins (or solder balls) on a package where memory device 100 may reside. Other devices external to memory device 100 (e.g., a memory controller or a processor) may use signals DQ0 through DQN on lines 105 for further processing.

Memory device 100 may perform memory operations such as a read operation to read information from memory cells 103 and a write operation to write information into memory cells 103. A memory control unit 118 may control the memory operations (e.g., read and write operations) based on control signals on lines 120. Examples of the control signals include a row access strobe signal RAS*, a column access strobe signal CAS*, a write enable signal WE*, a chip select signal CS*, and a clock signal CLK. Applying specific values to a combination of these control signals (e.g., a combination of signals RAS*, CAS*, and WE*) may produce a command (e.g., read or write command) that may cause memory device 100 to perform a corresponding memory operation (e.g., read or write operation).

Memory control unit 118 may include a mode register circuit 119 to store values for various settings of memory device 100, such as a setting for a read latency value. The read latency value of memory device 100 may be set at a value corresponding to one or more cycles of a signal (e.g., the CLK signal). The read latency value indicates a delay, in one or more cycles of a signal such as the CLK signal, between a receipt of a read command and the availability of a first bit of information on lines 105. The read latency value of memory device 100 may include a so-called CAS latency value of a memory device such as memory device 100. A user may store values, such as the read latency value, in mode register circuit 119 by a method such as a programming process.

Memory device 100 of FIG. 1 may receive a supply voltage, including supply voltage signals Vcc and Vss, on lines 130 and 132, respectively. Supply voltage signal Vss may operate at a ground potential (e.g., having a value of approximately zero volts). Supply voltage signal Vcc may include an external voltage supplied to memory device 100 from an external power source such as a battery or an alternating current to direct current (AC-DC) converter circuitry.

During various memory operations, memory control unit 118 may generate signals, such as En0, En1, En2, En3, QinA, QinB, QinC, QinD, OutA/OutA*, OutB/OutB*, OutC/OutC*, OutD/OutD*, and CTL. Memory control unit 118 may include one or more counters (e.g., counters 133 and 134) to control the activations of one or more of these signals. The functions of these signals may be similar to or identical to those of a memory device of FIG. 4, as described below with reference to FIG. 4 and FIG. 5.

As shown in FIG. 1, lines 105 may include line pairs such as a line pair having signal pair Dio0/Dio0* and a line pair having signal pair DioZ/DioZ*. A person skilled in the art will readily recognize that two signals (e.g., signal pair Dio0/ Dio0*) may be used to represent information that is read from or written into a memory cell of a memory device, e.g., one of memory cells 103 of memory device 100). The two signals may have different values (e.g., complementary values), one of which may correspond to a true value of the information and the other one may correspond to a complementary value of the information. For example, in a read operation of memory device 100, the Dio0/Dio0* signal pair may present true and complementary values of the information read from one memory cell 103, and the DioZ/DioZ* signal pair may represent true and complementary values of the data read from another memory cell 103. In this example, the signal DQ0 on lines 105 may correspond to the true value of the information read from one memory cell 103, and the signal DQN on lines 105 may correspond to the true value of the information read from another memory cell 103.

Circuitry 111 may include a gating circuit 115 and an I/O (input/output) circuit 116. Gating circuit 115 may respond to signals CSel0 through CSelZ to select the Dio0/Dio0* through DioZ/DioZ* signal pairs that represent the information read from memory cells 103. Column access circuit 108 may selectively activate the CSel0 through CSelZ signals based on the A0 through AX address signals on lines 109. Gating circuit 115 may select the Dio0/Dio0* through DioZ/ DioZ* signal pairs and then provide them to I/O circuit 116 for further processing.

I/O circuit 116 may receive the Dio0/Dio0* through DioZ/ DioZ* signal pairs and then transfer them to lines 105 as the DQ0 through DQN signals. Memory device 100 may include a DLL (delay locked loop) circuit 117 to generate one or more signals (e.g., timing signal), one of which is shown as signal DLL in FIG. 1. I/O circuit 116 may use one or more of these DLL signals as timing signal(s), e.g., clock signal, during a transfer of information from memory cells 103 to lines 105.

For clarity, FIG. 1 shows an example of two signal pairs (the Dio0/Dio0* through DioZ/DioZ* signal pairs) on lines 106 and two signals (e.g., DQ0 and DQN) on lines 105. Memory device 100 may have many other signal pairs on lines 105 (e.g., signals similar to the Dio0/Dio0* through DioZ/DioZ* signal pairs) and many other signals on lines 105 (e.g., signals similar to the DQ0 through DQN signals).

FIG. 1 shows each of DQ0 through DQN signals in a single-ended form (i.e., without a complementary signal such as a DQ0* signal associated with the DQ0 signal, and without a complementary signal such as a DQN* signal associated with the DQN signal). In some embodiments, memory device 100 may include differential forms (e.g., complementary form) of each of DQ0 through DQN signals (e.g., including both DQ0 and DQ0* signals and both DQN and DQN* signals).

Memory device 100 may include a "4n" prefetch architecture, where "n" is an integer, e.g., 4, 8, 16, or other number, such that memory device 100 may read 4n-bit-wide of information from memory cells 103 for each read operation (e.g., in respond to each read command). For example, when n=8, memory device 100 may read a single 32 bit-wide (4×8) of information from memory cells 103 in one clock cycle (e.g., one cycle of the CLK signal) for each read operation. In this example, memory device 100 may provide the 32-bit-wide of information to lines in two clock cycles, with four sets of 8-bit-wide of information being provided on lines 105 (e.g., eight lines 105, one bit on each line) in each one-half clock cycle. Memory device 100 may read memory cells 103 in a burst-oriented fashion such that, during a read operation, it may start reading a memory cell 103 at a selected location (based on the address on lines 109) and then continue for a number of locations based on a programmed number such as a burst length. Mode register circuit 119 may store the burst length. For example, when the burst length is four, memory device 100 may read a first memory cell 103 during a read operation (based on the address on lines 109) and then continue reading three other memory cells in the series of four memory cells 103.

Memory device 100 may include a dynamic random access memory (DRAM) device, a static random access memory (SRAM) device, or other memory devices, or a combination of these memory devices. Memory device 100 may include other components, which are not shown to help focus on the embodiments described herein. Memory device 100 may be configured to include at least a portion of the memory device with associated structure, or function, or both, as described with reference to FIG. 2 through FIG. 12 below.

Figure 2:
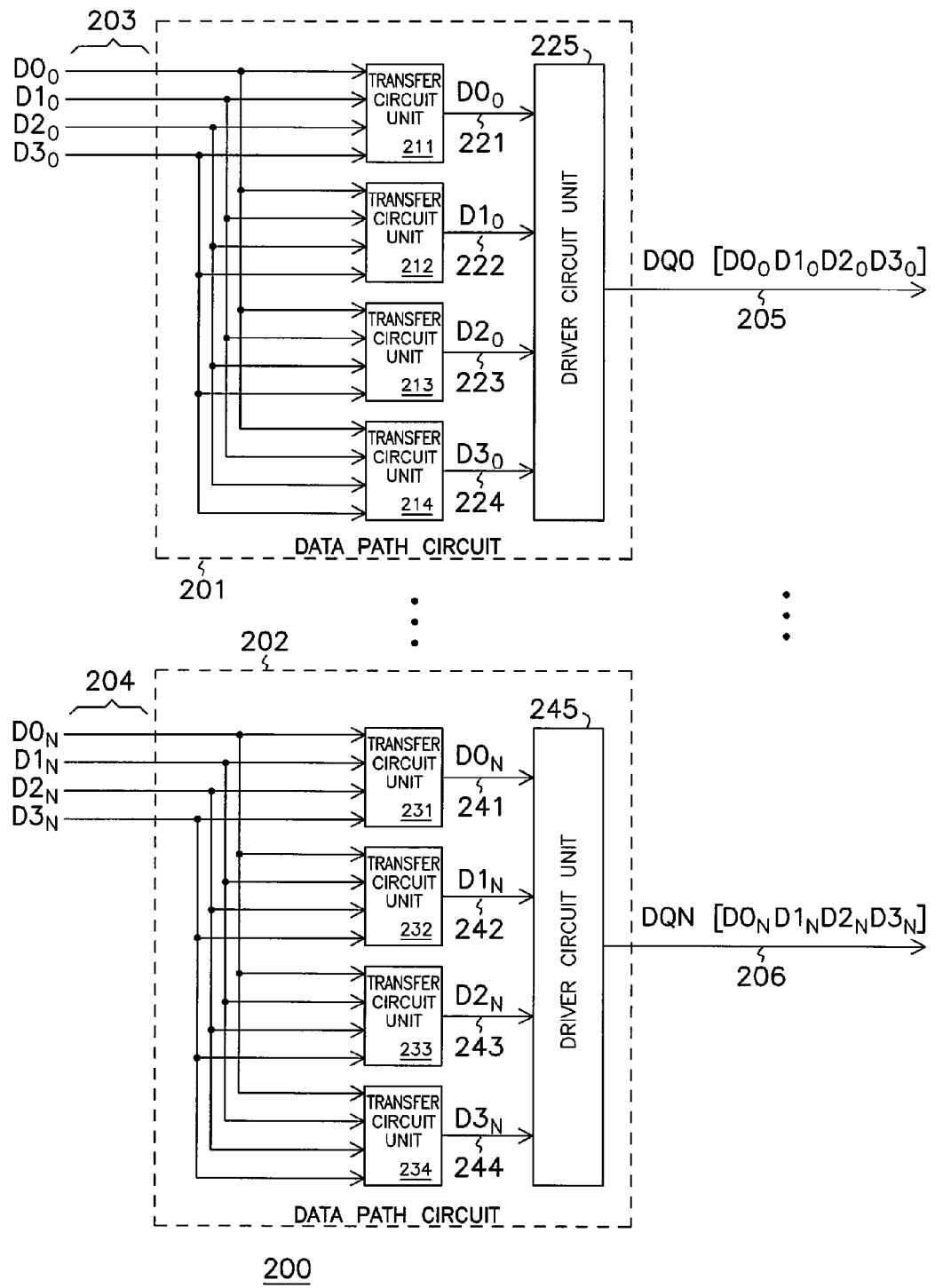
FIG. 2 shows a partial block diagram of a memory device including data path circuits according to an embodiment of the invention.

FIG. 2 shows a partial block diagram of a memory device 200 including data path circuits 201 and 202 according to an embodiment of the invention. Memory device 200 may correspond to memory device 100 of FIG. 1, where data path circuits 201 and 202 may correspond to a portion of I/O circuit 116 of FIG. 1. In FIG. 2, memory device 200 may use data path circuits 201 and 202 to receive, at nodes 203 and 204, information read from its memory cells (not shown in FIG. 2) and then transfer the information from nodes 203 and 204 to nodes 205 and 206. For ease of following the embodiments described herein, the description may occasionally uses the term "node(s)" to describe a circuit element(s), e.g., a circuit node(s), a circuit trace(s), or a circuit connection(s), but the drawings may show a reference to that node(s) as a line(s). For example, in describing FIG. 2, the description describes nodes 205, but FIG. 2 shows nodes 205 as lines 205.

Signals $D0_O$, $D1_O$, $D2_O$, and $D3_O$ at nodes 203 and 205 may represent the information read from one group of memory cells, which may include four memory cells located at the same row and in four consecutive columns of memory device 200. Data path circuit 201 may receive the $D0_O$, $D1_O$, $D2_O$, and $D3_O$ signals at nodes 203 in parallel (each signal being received at a different node and at substantially the same time with respect to other signals). Then, data path circuit 201 may serially transfer the $D0_O$, $D1_O$, $D2_O$, and $D3_O$ signals to node 205 (different signals being transferred to the same node 205) as information DQ0.

Signals $D0_N$, $D1_N$, $D2_N$, and $D3_N$ at nodes 204 and 206 may represent the information read from another group of memory cells, which may include another four memory cells. Data path circuit 202 may receive the $D0_N$, $D1_N$, $D2_N$, and $D3_N$ signals at nodes 204 in parallel and then serially transfer them to node 206 as information DQN.

Data path circuit 201 may include transfer circuit units 211, 212, 213, and 214, each receiving the same signals $D0_O$, $D1_O$, $D2_O$, and $D3_O$. Each of transfer circuit units 211, 212, 213, and 214 may select a different signal among the $D0_O$, $D1_O$, $D2_O$, and $D3_O$ signals and then transfer the selected signal to one of nodes 221, 222, 223, and 224. A driver circuit unit 225 may receive the $D0_O$, $D1_O$, $D2_O$, and $D3_O$ signals from nodes 221, 222, 223, and 224 in parallel and then serially transfer them to node 205.

Data path circuit 202 may include transfer circuit units 231, 232, 233, and 234, each receiving the same signals $D0_N$, $D1_N$, $D2_N$, and $D3_N$. Each of transfer circuit units 231, 232, 233, and 234 may select a different signal among the $D0_N$, $D1_N$, $D2_N$, and $D3_N$ signals and then transfer the selected signal to one of nodes 241, 242, 243, and 244. A driver circuit unit 245 may receive the $D0_N$, $D1_N$, $D2_N$, and $D3_N$ signals from nodes 241, 242, 243, and 244 in parallel and then serially transfer them to node 206.

FIG. 2 shows an example where transfer circuit units 211, 212, 213, and 214 may select the signals at nodes 203 in an order of $D0_O$, $D1_O$, $D2_O$, and $D3_O$, respectively. In some embodiments, transfer circuit units 211, 212, 213, and 214 may select signals at nodes 203 in an order (e.g., $D1_O$, $D2_O$, $D3_O$, and $D0_O$, or other order) that is different from the order shown in FIG. 2. Similarly, transfer circuit units 231, 232, 233, and 234 may select the signals at nodes 204 in an order (e.g., $D1_N$, $D2_N$, $D3_N$, and $D0_N$, or other order) that is different from the order shown in FIG. 2. Further, for clarity, FIG. 2 shows only two data path circuits 201 and 202. Memory device 200 may include many other data path circuits (e.g., four, eight, sixteen, or other number) that are similar to or identical to data path circuit 201 or 202. The following description refers to both FIG. 2 and FIG. 3.

Figure 3:
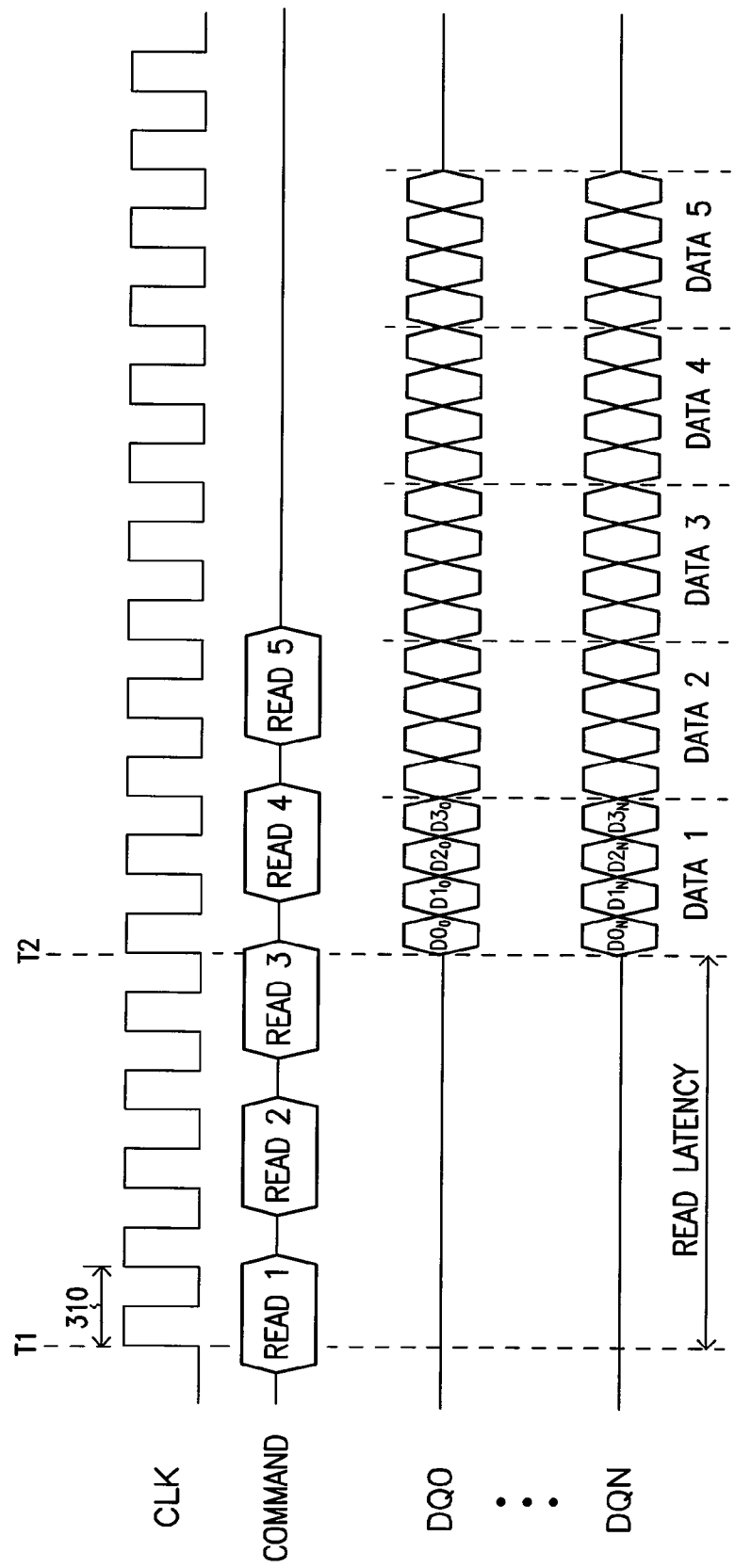
FIG. 3 is an example timing diagram for the memory device of FIG. 2 during a read operation.

FIG. 3 is an example timing diagram for memory device 200 of FIG. 2 during a read operation. In FIG. 3, T1 and T2 represent different instances in time. Signal CLK may correspond to a clock signal of memory device 200. Memory device 200 may receive one or more read commands, such as five read commands READ 1, READ 2, READ 3, READ 4, and READ 5. The DQ signal may carry information DATA 1, DATA 2, DATA 3, DATA 4, and DATA 5, which may represent the information read from the memory cells of memory device 200 based on read commands READ 1, READ 2, READ 3, READ 4, and READ 5, respectively. The DQ0 signal may include signal portions $D0_O$, $D1_O$, $D2_O$, and $D3_O$, which may correspond to those of FIG. 2, representing four bits of information. The DQN signal may include signal portions $D0_N$, $D1_N$, $D2_N$, and $D3_N$, which may correspond to those of FIG. 2, representing another four bits of information. For the purposes of describing FIG. 3, the read latency value of memory device 200 may be set at five cycles of a clock signal such as the CLK signal. FIG. 3 shows the CLK signal with a cycle 310. Thus, in a read operation based on read command READ 1, memory device 200 may provide a first bit of information (e.g., the bit represented by the $D0_O$ signal portion of the DQ signal) of DATA 1 at time T2, which is five cycles of the CLK signal from time T1. The other information DATA 2, DATA 3, DATA 4, and DATA 5 may be provided after DATA 1.

FIG. 2 shows data path circuits 201 and 202 receiving each of $D0_O$, $D1_O$, $D2_O$, and $D3_O$ signals at nodes 203 and each of signals $D0_N$, $D1_N$, $D2_N$, and $D3_N$ signals at nodes 204 as a single-ended signal form. In some embodiments, data path circuit 201 and 202 may receive a differential form (e.g., complementary form) of each of these signals.

Figure 4:
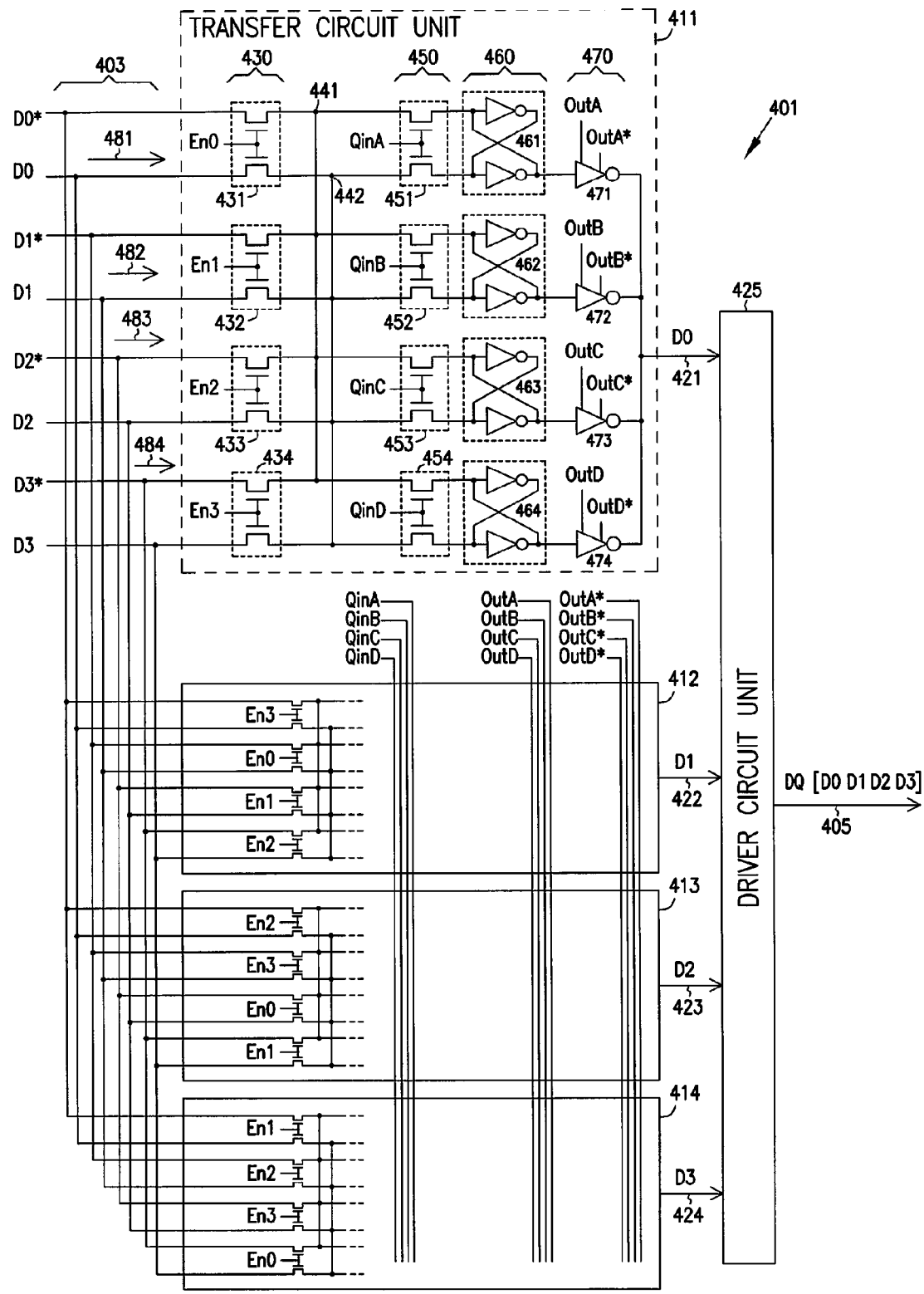
FIG. 4 shows a partial schematic diagram of a memory device including a data path circuit with transfer circuit units according to an embodiment of the invention.

FIG. 4 shows a partial schematic diagram of a memory device 400 including a data path circuit 401 with transfer circuit units 411, 412, 413, and 414 according to an embodiment of the invention. Memory device 400 may correspond to memory device 100 of FIG. 1. For clarity, FIG. 4 shows detailed circuit elements of only transfer circuit unit 411. Other transfer circuit units 412, 413, and 414 may include circuit elements similar to or identical to those of transfer circuit unit 411. Memory device 400 may include memory cells (not shown in FIG. 4) similar to or identical to memory cells 103 of memory device 100 of FIG. 1. Memory device 400 of FIG. 4 may use data path circuit 401 to transfer a portion of information read from its memory cells to node 405. In FIG. 4, memory device 400 may include other data path circuits, similar to or identical to data path circuit 401, to transfer other portions of information read from its memory cells to other nodes, similar to or identical to node 405. FIG. 4 omits the other data path circuits for simplicity.

In FIG. 4, four signal pairs D0/D0*, D1/D1*, D2/D2*, and D3/D3* may represent the information that is read from the memory cells of memory device 400 and transferred to nodes 403 in parallel. Each of transfer circuit units 411, 412, 413, and 414 may select a different signal pair among the signal pairs D0/D0*, D1/D1*, D2/D2*, and D3/D3* and then transfer one signal of the selected signal pair to a corresponding node 421, 422, 423, or 424. For example, as shown in FIG. 4, transfer circuit units 411, 412, 413, and 414 may select and then transfer signals D0, D1, D2, and D3 to nodes 421, 422, 423, and 424, respectively. Thus, each of D0, D1, D2, and D3 signals may represent a bit of information read from a different memory cell of memory device 400. A driver circuit unit 425 may operate to serially transfer these bits of information (represented by signals D0, D1, D2, and D3) to node 405 as signal DQ. Driver circuit unit 425 may include an embodiment of a driver circuit of FIG. 7.

In the description herein, the term "signal pairs" refers to a plurality of signal pairs such as signal pair D0/D0*, signal pair D1/D1*, signal pair D2/D2*, and signal pair D3/D3* shown in FIG. 4. However, for simplicity, the description herein may occasionally omit "D0/D0*, D1/D1*, D2/D2*, and D3/D3*" when the "signal pairs" is mentioned. As shown in FIG. 4, the signal pairs may be received at eight different nodes. For simplicity, these eight nodes (or four node pairs) are collectively referred to as nodes 403.

As shown in FIG. 4, each of the signal pairs at nodes 403 includes two signals. The two signals may have different values (e.g., complementary values) such that one signal may have one value (e.g., logic one value, also referred to as binary one value) and the other signal may have a different value (e.g., logic zero value, also referred to as binary zero value). For example, in signal pair D0/D0*, the D0 signal may have a logic one value and the D0* signal have a logic zero value.

Transfer circuit unit 411 may include a select circuit 430 to select one of the signal pairs, an input circuit 450 to transfer the selected signal pair to a holding circuit 460, which may hold the selected signal pair for a time interval, and an output circuit 470 to transfer a signal of the selected signal pair to driver circuit unit 425. Each of the other transfer circuit units 412, 413, and 414 may include circuit elements (e.g., a select circuit, an input circuit, a holding circuit, and output circuit) similar to or identical to those of transfer circuit unit 411.

Select circuit 430 may include transistor pairs 431, 432, 433, and 434 with each pair having non-gate terminals coupled to two of nodes 403, as shown in FIG. 4, to receive one of the signal pairs from nodes 403. In the description herein, a non-gate terminal of a transistor refers to a terminal that is not a gate of a transistor. For example, a transistor (e.g., p-channel or n-channel transistor) may include a gate (gate terminal), a source terminal, and a drain terminal, in which case the source and drain terminals of the transistor are designated as the non-gate terminals of the transistor.

In FIG. 4, memory device 400 may use signals En0, En1, En2, and En3 and activate these signals one at a time such that when one of these signals (e.g., En0) is activated, the other three signals (e.g., En1, En2, and En3) may be deactivated. In operation, depending on which one of the signals En0, En1, En2, and En3 is activated, one of transistor pairs 431, 432, 433, and 434 may turn on and transfer one of the signal pairs from nodes 403 to nodes 441 and 442. For example, when memory device 400 activates the En0 signal (En1, En2, and En3 being deactivated), transistor pair 431 may turn on and transfer signal pair D0/D0* from nodes 403 to nodes 441 and 442. In another example, when memory device 400 activates the En1 signal (En0, En2, and En3 being deactivated), transistor pair 432 may turn on and transfer signal pair D1/D1* from nodes 403 to nodes 441 and 442. In the description herein, an activated signal may have one signal level (e.g., a high voltage level such as voltage Vcc) and a deactivated signal may have another signal level (e.g., a low signal level such as ground potential). Thus, depending on which one of the signals En0, En1, En2, and En3 is activated, select circuit 430 may select any one of the signal pairs and transfer the selected signal pair to nodes 441 and 442. Input circuit 450 may transfer the selected signal pair at nodes 441 and 442 to holding circuit 460.

Input circuit 450 may include transistor pairs 451, 452, 453, and 454, with each pair having non-gate terminals coupled to nodes 441 and 442 to receive the selected signal pair from nodes 441 and 442 (selected by select circuit 430). Memory device 400 may use signals QinA, QinB, QinC, and QinD and activate these signals one at a time such that when one of these signals (e.g., Qin0) is activated, the other three signals (e.g., Qin1, Qin2, and Qin3) may be deactivated. Memory device 400 may include a counter (which may be similar to or identical to one of counters 133 and 134 of FIG. 1) to activate the QinA, QinB, QinC, and QinD signals based on a count value of the counter.

In operation, depending on which one of the signals QinA, QinB, QinC, and QinD is activated (as described in more detail with reference to FIG. 5), one of transistor pairs 451, 452, 453, and 454 may turn on and transfer the selected signal pair from nodes 441 and 442 to one of storage elements 461, 462, 463, and 464 of holding circuit 460. For example, when memory device 400 activates the QinA signal (QinB, QinC, and QinD deactivated), transistor pair 451 may turn on and transfer the selected signal pair (e.g., D0/D0* or other pair) from nodes 441 and 442 to storage element 461. In another example, when memory device 400 activates the QinB signal (QinA, QinC, and QinD being deactivated), transistor pair 452 may turn on and transfer the selected signal pair (e.g., D1/D1* or other pair) from nodes 441 and 442 to storage element 462.

As shown in FIG. 4, since transistor pairs 431, 432, 433, 434, 451, 452, 453, and 454 may include a number of transistors (e.g., 16 n-channel transistors) with an identical transistor type, memory device 400 may have a relatively reduced circuit layout area in comparison to circuit layout of a memory device with transistor pairs of mix transistor types (e.g., a mix of both p-channel or n-channel transistor types).

FIG. 4 shows an example where each of the four storage elements 461, 462, 463, and 464 may include a pair of inverters arranged in a cross-coupled configuration, as shown in FIG. 4, forming a static memory element to hold values of the selected signal pair (e.g., hold values of bits of information represented by one of the signal pairs D0/D0*, D1/D1*, D2/D2*, or D3/D3*). In other examples, each of storage elements 461, 462, 463, and 464 may include other types of storage elements to store a value of a signal. Thus, in the description herein, a storage element may include the storage element having a static memory element as shown in FIG. 4 (storage element 461, 462, 463, or 464) or may include other storage elements such as SR-latches or other types of latches.

As described above, the values of each of the signal pairs may include logic one and logic zero values. The values of the selected signal pair may be held in one of the storage elements 461, 462, 463, and 464 for a time interval. At an appropriate time, output circuit 470 may transfer one signal (e.g., signal D0) of the selected signal pair to node 421 for further processing by driver circuit unit 425. In some embodiments, the time interval that values of a selected signal pair being held in one of the storage elements 461, 462, 463, and 464 may be a function of (e.g., less than) the time interval based on the read latency value of memory device 400.

Output circuit unit 470 may include circuit unit elements 471, 472, 473, and 474, and each may include an inverter coupled to a corresponding storage element 461, 462, 463, or 464, as shown in FIG. 4. Each of circuit unit elements 471, 472, 473, and 474 may include an embodiment of a circuit unit element of FIG. 6. In FIG. 4, memory device 400 may use signal sets OutA/OutA*, OutB/OutB*, OutC/OutC*, and OutD/OutD* and activate these signal sets one set at a time such that when one of these signal sets (e.g., OutA/OutA*) is asserted, the other three signal sets (e.g., OutB/OutB*, OutC/OutC*, and OutD/OutD*) may be unasserted. Memory device 400 may include a counter (which may be similar to or identical to one of counters 133 and 134 of FIG. 1) to activate the signal sets OutB/OutB*, OutC/OutC*, and OutD/OutD* based on a count value of the counter. The counter used in association with these signals may be different from the counter used in association with the activation of the signals QinA, QinB, QinC, and QinD.

In operation, depending on which one of the signal sets OutA/OutA*, OutB/OutB*, OutC/OutC*, and OutD/OutD* is asserted (as described in more detail with reference to FIG. 5), one of circuit unit elements 471, 472, 473, and 474 may operate to transfer one signal of the selected signal pair from one of storage elements 461, 462, 463, and 464 to node 421. For example, when memory device 400 asserts the signal set OutA/OutA* (OutB/OutB*, OutC/OutC*, and OutD/OutD* being unasserted), circuit unit element 471 may operate to transfer one signal of the selected signal pair (e.g., the D0 signal) held in storage element 461 to node 421.

As shown in FIG. 4, transfer circuit unit 411 may include transfer paths 481, 482, 483, and 484 with corresponding circuit components (e.g., select circuit 430, input circuit 450, holding circuit 460, and output circuit 470) coupled between nodes 403 and 421. As described above, transfer circuit unit 411 may operate to select from among the D0/D0*, D1/D1*, D2/D2*, and D3/D3* signal pairs a selected signal pair (e.g., D0/D0*), hold values of the selected signal pair for a time interval, and then transfer one signal of the selected signal pair (e.g., the D0 signal) to node 421. As shown in FIG. 4 and as described herein, since each of transfer paths 481, 482, 483, and 484 includes only one storage element coupled between nodes 403 and node 421 (e.g., storage element 461 of transfer path 481), memory device 400 may have a relatively higher transfer speed in comparison to a memory device with more than one storage elements in each transfer path.

Transfer circuit units 412, 413, and 414 may operate in a fashion similar to or identical to that of transfer circuit unit 411 to transfer other signals of the other signal pairs (e.g., the D1, D2, and D3 signals) to nodes 422, 423, and 424. Each of transfer circuit units 412, 413, and 414 may include transfer paths similar to or identical to those of transfer circuit unit 411. For example, the circuit paths of transfer circuit units 412, 413, and 414 may couple to signals QinA, QinB, QinC, QinD, OutA/OutA*, OutB/OutB*, OutC/OutC*, and OutD/OutD* in a way similar to or identical to that of transfer circuit 411. Therefore, for simplicity, FIG. 4 omits detail connections of these signals within transfer circuit units 412, 413, and 414.

The signals En0, EN1, En2, and En3, however, may couple to the transfer paths of each of transfer circuit units 412, 413, and 414 in a way different from that of transfer circuit unit 411, as shown in an example in FIG. 4. The different connection of the En0, EN1, En2, and En3 signals among transfer circuit units 411, 412, 413, and 414 may allow each of the transfer circuit units 412, 413, and 414 to select a different signal pair at nodes 403 when the one of signals En0, EN1, En2, and En3 is activated. For example, as shown in FIG. 4, since the En0 signal is coupled to a different transfer path among transfer circuit units 411, 412, 413, and 414, when memory device 400 activates the En0 signal, transfer circuit unit 411 may select signal pair D0/D0*, transfer circuit unit 412 may select signal pair D1/D1*, transfer circuit unit 411 may select signal pair D2/D2*, and transfer circuit unit 411 may select signal pair D3/D3*.

Memory device 400 may activate the En0, En1, En2, and En3 signals based on the addresses used to read the memory cells during a read operation. For example, based on a value of a burst length (as described above with reference to FIG. 1), memory device 400 may read four bits of information from a series of four memory cells. Memory device 400 may use a value (e.g., value of two bits such as the two least significant bits) of a portion of the address of the first memory cell in the series to determine which one of the En0, En1, En2, and En3 signals to activate. For example, memory device 400 may be configured in a way such that it may activate the En0, En1, En2, and En3 signals if the value of two bits of the address used to read the first memory cell (in the series of four memory cells) is 00, 01, 10, and 11, respectively. Thus, depending on the addresses used to read the memory cells, memory device 400 may activate one of En0, En1, En2, and En3 signals to allow each of transfer circuit units 411, 412, 413, and 414 to appropriately select the signal pairs at nodes 403 for transferring to node 405 during a read operation.

Figure 5:
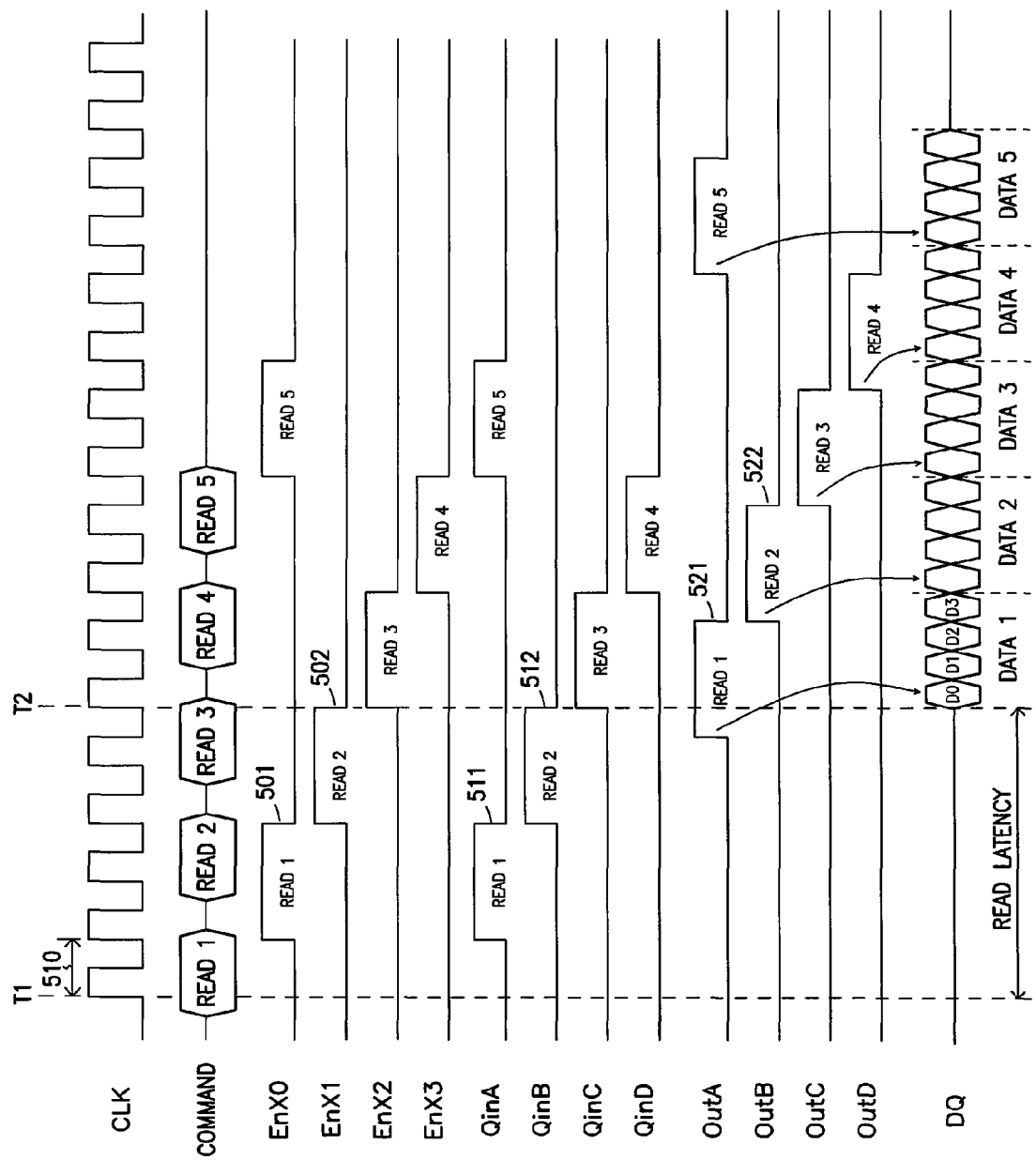
FIG. 5 is an example timing diagram for the memory device of FIG. 4 during a read operation.

The following description refers to both FIG. 4 and FIG. 5.

FIG. 5 is an example timing diagram for the memory device of FIG. 4 during a read operation. In FIG. 5, T1 and T2 represent different instances in time. Signal CLK corresponds to a clock signal of memory device 400. Memory device 400 may receive one or more read commands, such as five read commands READ 1, READ 2, READ 3, READ 4, and READ 5. The DQ signal may carry information DATA 1, DATA 2, DATA 3, DATA 4, and DATA 5, which may represent the information read from the memory cells of memory device 400 based on read commands READ 1, READ 2, READ 3, READ 4, READ 5, respectively. The DQ signal may include signal portions D0, D1, D2, and D3, corresponding to those of FIG. 4 and representing four bits of information. For the purposes of describing FIG. 5, the read latency of memory device 400 may be set at five cycles of a clock signal such as the CLK signal. FIG. 5 shows the CLK signal with a cycle 510. Thus, as shown in FIG. 5, memory device 400 may provide a first bit of information (e.g., the bit represented by the D0 signal portion of the DQ signal) of DATA 1 at time T2, which is five cycles of the CLK signal from time T1. The other information DATA 2, DATA 3, DATA 4, and DATA 5 may be provided after DATA 1.

For ease of following the timing diagram of FIG. 5, besides the actual read commands READ 1 through READ 5 associated with the "COMMAND" indicator, FIG. 5 also shows other READ 1 through READ 5 labels (not read commands) next to a portion of a particular signal to help indicate which activation corresponds to which read command. For example, the label READ 1 next to signal portions 501, 511, and 521 of signals EnX0, QinA, and OutA, respectively, indicates that the activation of these signals at signal portions 501, 511, and 521 may be based on the read command READ 1. In another example, the label READ 2 next to signal portions 502, 512, and 522 of signals EnX1, QinB, and OutB, respectively, indicates that the activation of these signals at signal portions 502, 512, and 522 may be based on the read command READ 2.

As shown in FIG. 5, the OutA may be activate before T2 (e.g., in less than a cycle of the CLK signal before time T2) so that driver circuit 425 (FIG. 4) may properly prepare (e.g., have enough time) to provide the D0, D1, D2, and D3 signals to node 405 at time T2, which is five clock cycles from time T1 (assuming the read latency value is set at five cycles of the CLK signal).

As described above with reference to FIG. 4, memory device 400 may activate one of the En0, En1, En2, and En3 signals based on the value of the addresses used to read the memory cells of memory device 400 (e.g., address of a first memory cell in a series of memory cells). Thus, in FIG. 5, each of EnX0, EnX1, EnX2, and EnX3 signals may represent any one the En0, En1, En2, and En3 signals of FIG. 4 because the addresses used to read the memory cells in different read operations may have different values.

As shown in FIG. 5, memory device 400 may activate the QinA, QinB, QinC, and QinD signals in a sequential fashion such that one signal after another may be activated (in the order shown in FIG. 5) in correspondence to the order of the sequence of the read commands READ 1 through READ 5. Similarly, Memory device 400 may activate the signals OutA, OutB, OutC, and OutD in a sequential fashion such that such one signal after another may be activated (in the order shown in FIG. 5) in correspondence to the sequence of the read commands READ 1 through READ 5. For simplicity, FIG. 5 omits the waveforms for signals OutA*, OutB*, OutC*, and OutD*. The waveforms for these signals may be inverted versions of the OutA, OutB, OutC, and OutD signals shown in FIG. 5 and may be activated sequentially in a fashion similar to or identical to that of the OutA, OutB, OutC, and OutD signals.

As shown in FIG. 5, the order of the activation of the QinA, QinB, QinC, and QinD signals may be similar to the order of the activation of the OutA, OutB, OutC, and OutD signals. The sequential activation of the QinA, QinB, QinC, and QinD signals in combination with the sequential activation of the OutA, OutB, OutC, and OutD signals in similar activation order may allow memory device 400 to provide information (e.g., information represented by signal DQ) in a way such that a first information (e.g., DATA 1 corresponding to READ 1) transferred to each of transfer circuit units 411, 412, 413, and 414 may be the first information to be transferred out to node 405.

Memory device 400 may repeat the activation of the QinA, QinB, QinC, and QinD signals to accommodate multiple read commands (e.g., READ 1 through READ 5) such that after the last signal in the sequence (e.g., after QinD associated with READ 4) is activated, the first signal in the sequence (e.g., QinA associated with READ 5) may be reactivated. For example, as mentioned above, memory device 400 may include a counter for use in association with the activation of the QinA, QinB, QinC, and QinD signals. In FIG. 5, memory device 400 may sequentially activate the QinA, QinB, QinC, and QinD signals when the count values of the counter are, for example, zero, one, two, and three, respectively. The counter may repeat the count value after a number of counts (e.g., repeat count zero after count three). Thus, memory device 400 may repeat the activation of the QinA, QinB, QinC, and QinD signals based on the repeated count values of the counter.

Similarly, memory device 400 may repeat the activation of the OutA, OutB, OutC, and OutD signals to accommodate multiple read commands (e.g., READ 1 through READ 5) such that after the last signal in the sequence (i.e., after OutD associated with READ 4) is activated, the first signal in the sequence (i.e., OutA associated with READ 5) may be reactivated. For example, as mentioned above, memory device 400 may include an additional counter for use in association with the activation of the OutA, OutB, OutC, and OutD signals. In FIG. 5, memory device 400 may sequentially activate the OutA, OutB, OutC, and OutD signals when the count values of the additional counter are, for example, zero, one, two, and three, respectively. The additional counter may repeat the count values after a number of counts (e.g., repeat count zero after count three). Thus, memory device 400 may repeat the activation of the OutA, OutB, OutC, and OutD signals based on the repeated count values of the counter. Using counters in association with the activations signals (such as the QinA, QinB, QinC, QinD, OutA/OutA*, OutB/OutB*, OutC/OutC*, and OutD/OutD* signals) may offer relatively more ease in controlling the transfer of signals (such as the D0, D1, D2, and D3 signals in FIG. 4) in comparison with other technique such as using non-counter output signals (e.g., short pulses).

Figure 6:
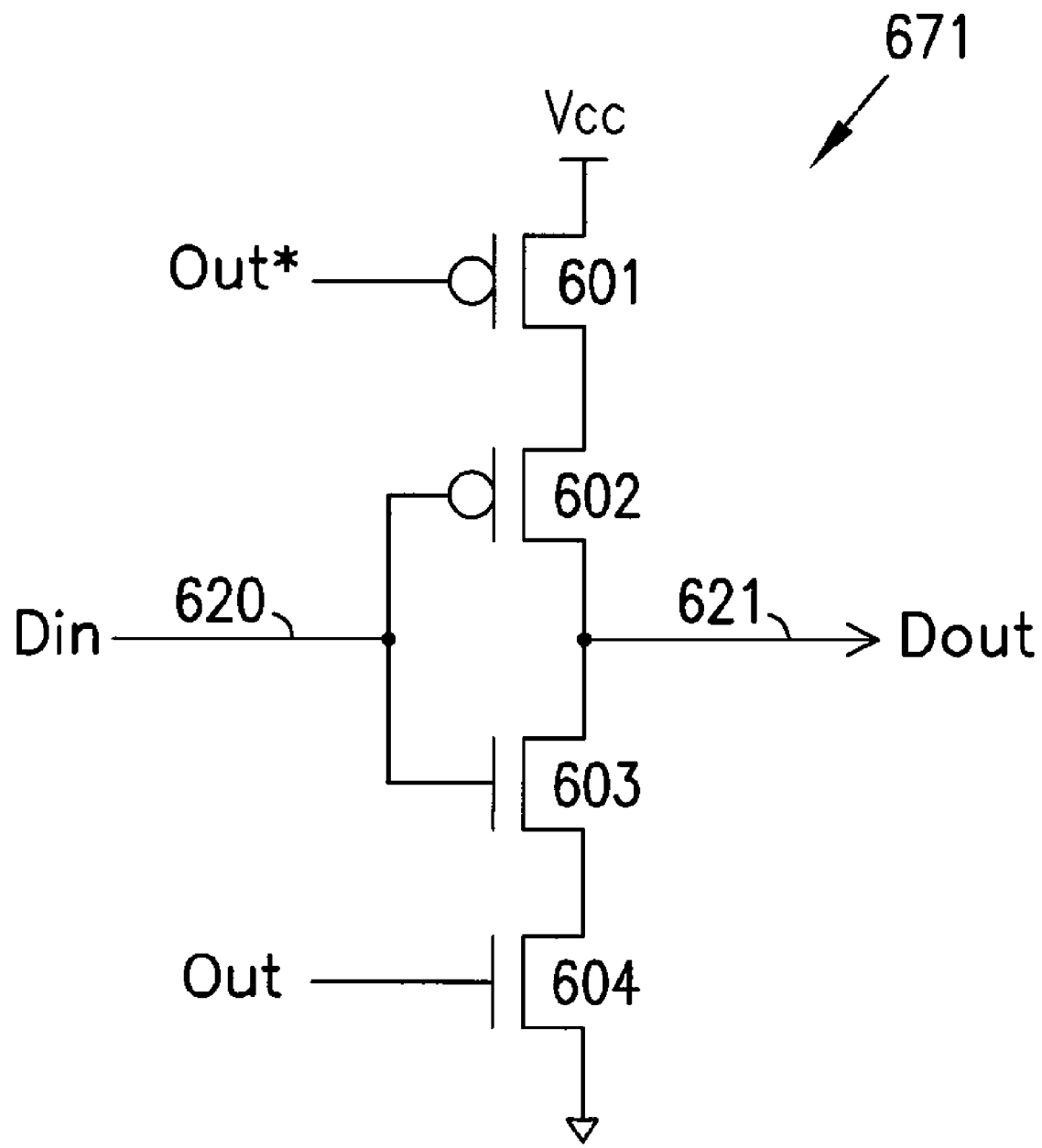
FIG. 6 shows a circuit unit element according to an embodiment of the invention.

FIG. 6 shows a circuit unit element 671 according to an embodiment of the invention. Circuit element 671 may corresponds to each of the circuit unit elements 471, 472, 473, and 474 of FIG. 4. In FIG. 6, circuit unit element 671 may include transistors 601, 602, 603, and 604, forming an inverter. Circuit unit element 671 may respond to a signal set Out/Out* to control a transfer of a signal Din from node 620 to a node 621. A signal DOut provided at node 621 may be an inversion of signal Din. In operation, when the Out signal has high signal level (e.g., being activated to a voltage level such as Vcc), the Out* signal may have a low signal level (e.g., ground potential), transistors 601, 602, 603, and 604 may turn on and transfer information Din from node 620 to node 621 as information DOut. Signal set Out/Out* of FIG. 6 may correspond to each of signal sets OutA/OutA*, OutB/OutB*, OutC/OutC*, and OutD/OutD* of FIG. 4. The Din signal of FIG. 6 may have a value correspond to the value held in one of storage elements 461, 462, 463, and 464 of FIG. 4. The signal DOut may corresponding to one of the signal D0, D1, D2, and D3 at nodes 421, 422, 423, and 424 of FIG. 4.

Figure 7:
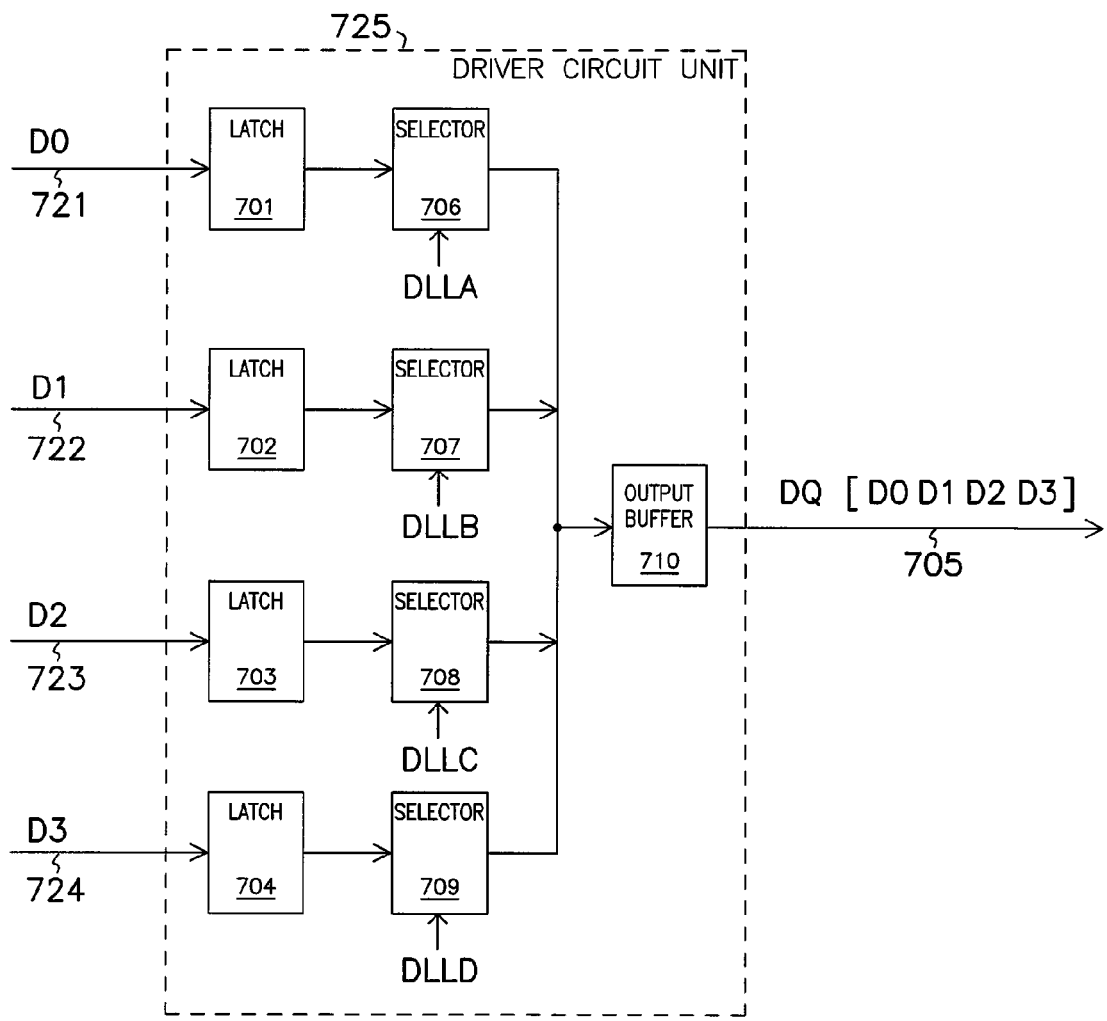
FIG. 7 shows a driver circuit unit according to an embodiment of the invention.

FIG. 7 shows a driver circuit unit 725 according to an embodiment of the invention. Driver circuit unit 725 may correspond to driver circuit unit 425 of FIG. 4. In FIG. 7, driver circuit unit 725 may include latches 701, 702, 703, and 704 to receive signals D0, D1, D2, and D3 at nodes 721, 722, 723, and 724, respectively. Each of selectors 706, 707, 708, and 709 may include a switch (e.g., a multiplexor, a transfer gate, or a pass transistor) that may respond to one of signals DLLA, DLLB, DLLC, and DLLD to transfer one of signals D0, D1, D2, and D3 from one of latches 701, 702, 703, and 704 to an output buffer 710 at different times. An output buffer 710, in turn, may serially transfer the D0, D1, D2, and D3 signals to node 705 as signal DQ. The DLLA, DLLB, DLLC, and DLLD signals of FIG. 7 may be provided by a DLL circuit such as DLL circuit 117 of FIG. 1. The D0, D1, D2, and D3 signals at nodes 721, 722, 723, and 724 of FIG. 7 may correspond to the D0, D1, D2, and D3 signals at nodes 421, 422, 423, and 424 of FIG. 4. The DQ signal at node 705 of FIG. 7 may correspond to the DQ signal at node 405 of FIG. 4.

Figure 8:
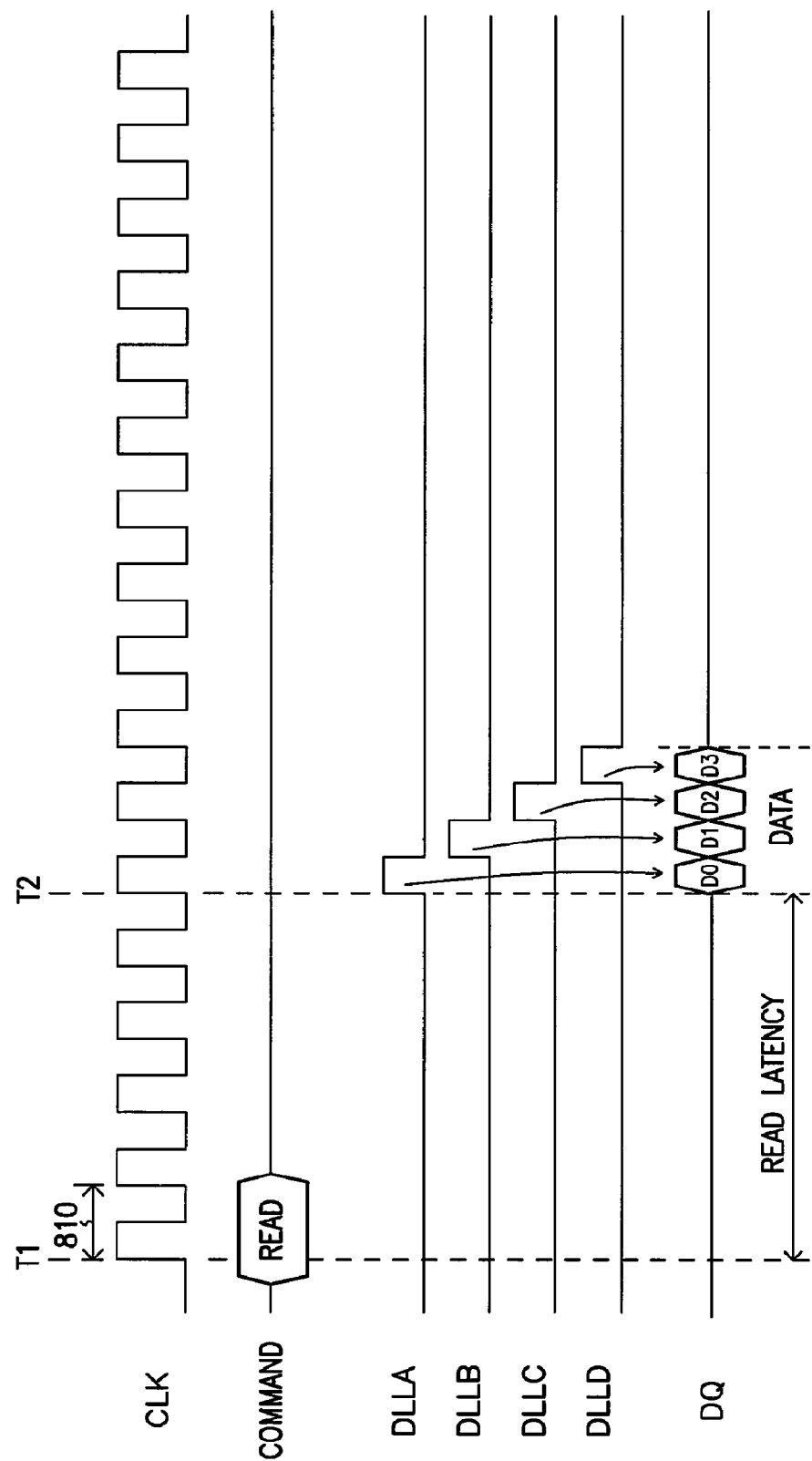
FIG. 8 is an example timing diagram for the driver circuit unit of FIG. 7.

FIG. 8 is an example timing diagram for driver circuit unit 725 of FIG. 7. In FIG. 8, the read latency value between time T1 and T2 may correspond to a read latency value of a memory device (e.g., memory device 400 of FIG. 4) where driver circuit unit 725 may reside. In the example timing diagram of FIG. 8, the read latency value may be set at five cycles of a signal CLK (e.g., clock signal). Thus, a first bit of information (e.g., represented by signal portion D0 of signal DQ) may be provided to node 705 at time T2, which is five cycles of the CLK signal from time T1 at which the memory device may receive a read command READ 1. As shown in FIG. 8, the DLLA signal may be activated at time T2 to provide the first bit of information (e.g., represented by signal portion D0) to node 705. The DLLB, DLLC, and DLLD may be activated after the activation of the DLLA signal to transfer the other bits of information (signal portions D1, D2, and D3 of the DQ signal) to node 705.

Figure 9:
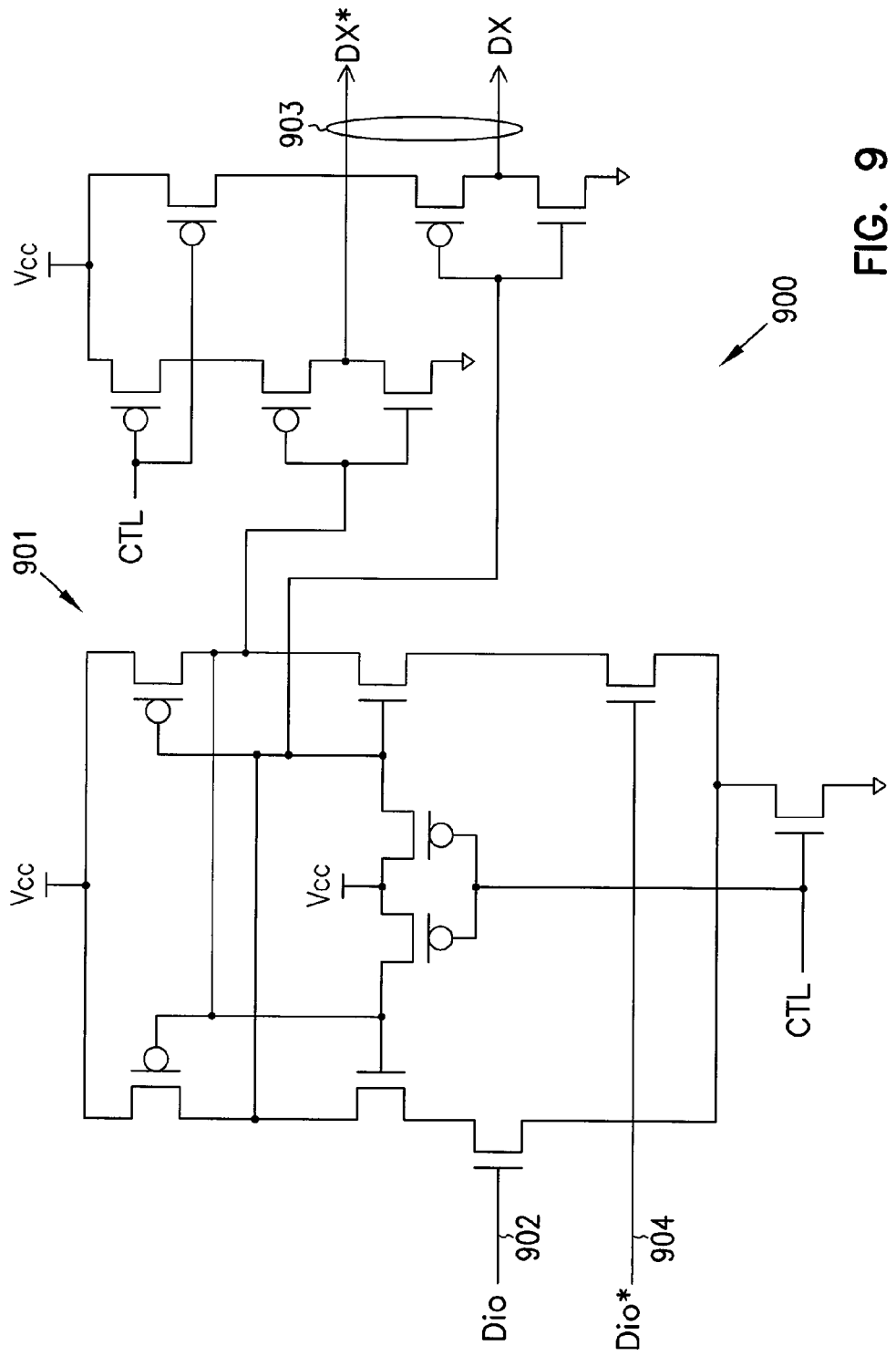
FIG. 9 shows an output circuit stage according to an embodiment of the invention.

FIG. 9 shows an output circuit stage 900 according to an embodiment of the invention. In some embodiments, output circuit stage 900 may correspond to a portion of an I/O circuit of a memory device such as I/O circuit 116 of memory device 100 of FIG. 1. In FIG. 9, signals Dio and Dio* at nodes 902 and 904, respectively, may correspond to signals Dio0 and Dio0* or signals DioZ and DioZ* of FIG. 1. Thus, the Dio and Dio* signals in FIG. 9 represent information read from a memory cell of a memory device (e.g., memory device 100 of FIG. 1 or memory device 400 of FIG. 4) where output circuit stage 900 may reside. Output circuit stage 900 may include a differential amplifier 901 that may use the Dio and Dio* signals as input signals (e.g., differential input signals) to generate a signal pair DX/DX* as output signals with different values (e.g., complementary values such as voltage Vcc and ground potential). At an appropriate time (e.g., when the Dio and Dio* signals are transferred to nodes 902 and 904 after a memory cell is read) the CTL signal may be activated (e.g., having a high signal level such as Vcc) to allow output circuit stage 900 to provide the DX/DX* at nodes 903.

Output circuit stage 900 may be used in memory device 400 such that each of signal pairs D0/D0*, D1/D1*, D2/D2*, and D3/D3* at nodes 403 of FIG. 4 may be provided by one of multiple (e.g., four) output circuit stages with each of the multiple output circuit stages being similar to or identical to output circuit stage 900 of FIG. 9. Thus, signal pair DX/DX* of FIG. 9 may correspond to one of signal pairs D0/D0*, D1/D1*, D2/D2*, and D3/D3* in FIG. 4.

Figure 10:
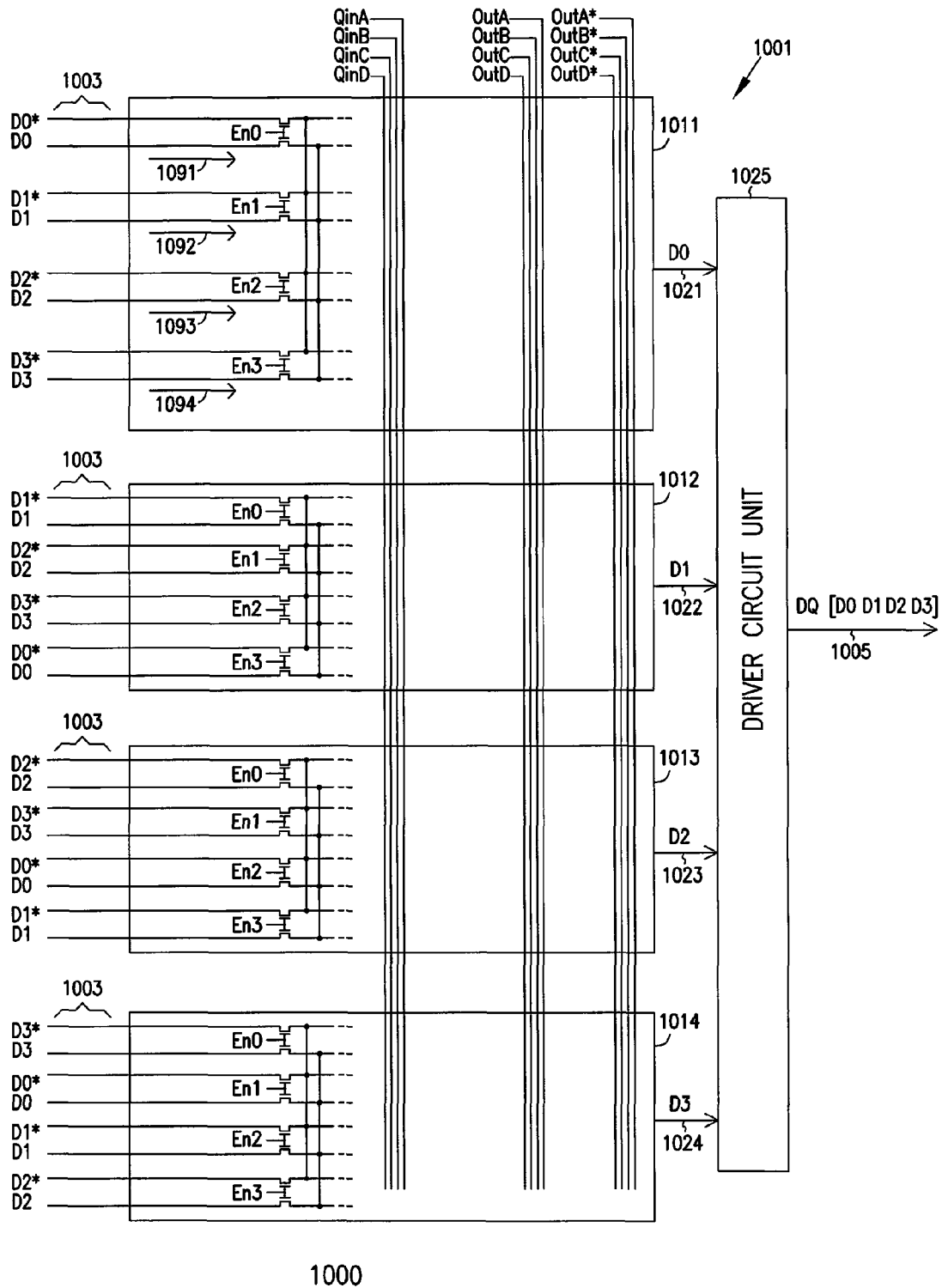
FIG. 10 shows a partial block diagram of a memory device with a data path circuit configured to receive information in a various orders according to an embodiment of the invention.

FIG. 10 shows a partial block diagram of a memory device 1000 with data path circuit 1001 configured to receive information in a various orders according to an embodiment of the invention. Memory device 1000 may correspond to memory device 100 of FIG. 1. In FIG. 10, data path circuit 1001 may receive signal pairs D0/D0*, D1/D1*, D2/D2*, and D3/D3* in parallel at transfer circuit units 1011, 1012, 1013, and 1014. However, each of transfer circuit units 1011, 1012, 1013, and 1014 may receive the signal pairs in a different order with respect to transfer paths 1091, 1092, 1093, and 1094 of each of transfer circuit units 1011, 1012, 1013, and 1014. For example, transfer circuit unit 1011 may receive the signal pair in an order of D0/D0*, D1/D1*, D2/D2*, and D3/D3* at transfer paths 1091, 1092, 1093, and 1094, respectively. In another example, transfer circuit unit 1012 may receive the signal pair in an order of D1/D1*, D2/D2*, D3/D3*, and D0/D0* at transfer paths 1091, 1092, 1093, and 1094, respectively. Transfer circuit units 1013 and 1014 may receive the signal pairs in other orders as shown in FIG. 10. Memory device 1000 may include a gating circuit similar to or identical to gating circuit 115 of FIG. 1 to allow memory device 1000 to select the different orders of the signal pairs that are transferred to data path circuit 1001.

Each of the other transfer circuit units 1011, 1012, 1013, and 1014 may include circuit elements (e.g., a select circuit, an input circuit, a holding circuit, and output circuit) similar to or identical to those of transfer circuit unit 411. For simplicity, FIG. 10 shows only portion of these circuit elements (e.g., portion coupled to the En0, En1, En2, and En3 signals). As shown in FIG. 10. memory device 1000 may include signals En0, En1, En2, En3, QinA, QinB, QinC, QinD, OutA/OutA*, OutB/OutB*, OutC/OutC*, and OutD/OutD*. Memory device 1000 may activate these signals at an appropriate time to transfer the signal pairs from nodes 1003 to nodes 1021, 1022, 1023, and 1024 in a fashion similar to or identical to that of memory device 400 of FIG. 4. For example, each of transfer paths 1091, 1092, 1093, and 1094 may select a different signal pair among the signal pairs at nodes 1003 and then transfer a signal of the selected signal pair to one of nodes 1021, 1022, 1023, and 1024. Driver circuit unit 1025 may serially transfer the signals (e.g., D0, D1, D2, and D3) at nodes 1021, 1022, 1023, and 1024 to node 1005 as signal DQ.

In FIG. 4, since memory device 400 of FIG. 4 may receive the signal pairs in the same order among the different transfer circuit units 411, 412, 413, and 414, memory device 400 may couple the En0, En1, En2, and En3 signals in a different way among transfer circuit units 411, 412, 413, and 414. In comparison, in FIG. 10, memory device 1000 may receive the signal pairs in a different order among different transfer circuit units 1011, 1012, 1013, and 1014, so memory device 100 may couple the En0, En1, En2, and En3 signals in the same way among transfer circuit units 1011, 1012, 1013, and 1014. This connection may allow each of transfer circuit units 1011, 1012, 1013, and 1014 to select a different one of the signal pairs and transfer the signal of the selected signal pair to one of nodes 1021, 1022, 1023, and 1024. For example, as shown in FIG. 10, when memory device 1000 activates the En0 signal, transfer circuit unit 1011 may select signal pair D0/D0*, transfer circuit unit 1012 may select signal pair D1/D1*, transfer circuit unit 1013 may select signal pair D2/D2*, and transfer circuit unit 1014 may select signal pair D3/D3*. Then, transfer circuit units 1011, 1012, 1013, and 1014 may transfer signals D0, D1, D2, and D3 to nodes 1021, 1022,1023, and 1024, respectively. As mentioned above, driver circuit unit 1025 may serially transfer D0, D1, D2, and D3 signals to node 1005 as signal DQ.

Figure 11:
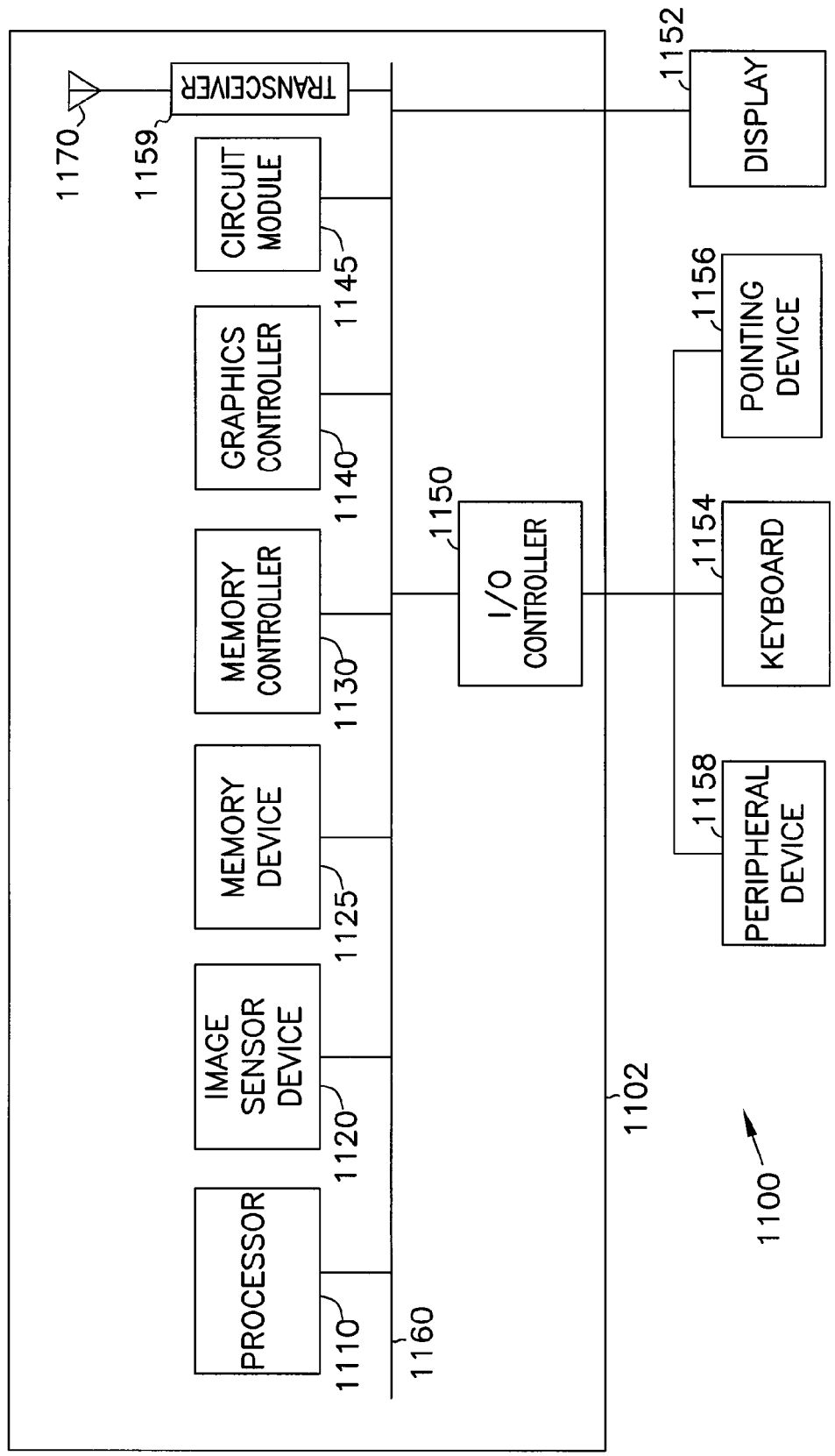
FIG. 11 shows a system according to an embodiment of the invention.

FIG. 11 shows a system 1100 according to an embodiment of the invention. System 1100 may include a processor 1110, an image sensor device 1120, a memory device 1125, a memory controller 1130, a graphics controller 1140, a circuit module 1145, an I/O controller 1150, a display 1152, a keyboard 1154, a pointing device 1156, a peripheral device 1158, a transceiver 1159, a bus 1160 to transfer information among the components of system 1100, and an antenna 1170 to wirelessly transmit and receive information to and from system 1100. Transceiver 1159 may operate to transfer information between one or more the components of system 1100 (e.g., at least one of processor 1110 and memory device 1125) and antenna 1170. The information received at antenna 1170 may be transmitted to system 1100 by a source (not shown) external to system 1100.

System 1100 may also include a circuit board 1102 on which some components of system 1100 may be located. In some embodiments, the number of components of system 1100 may vary. For example, in some embodiments, system 1100 may omit one or more of display 1152, image sensor device 1120, memory device 1125, and circuit module 1145.

Processor 1110 may include a general-purpose processor or an application-specific integrated circuit (ASIC). Processor 1110 may include a single-core processor or a multiple-core processor. Processor 1110 may execute one or more programming commands to process information. The information may include digital output information provided by other components of system 1100, such as by image sensor device 1120 or by memory device 1125.

Image sensor device 1120 may include a complementary metal-oxide-semiconductor (CMOS) image sensor having a CMOS pixel array or charge-coupled device (CCD) image sensor having a CCD pixel array.

Display 1152 may include an analog display or a digital display. Display 1152 may receive information from other components. For example, display 1152 may receive information that is processed by one or more of the image sensor device 1120, memory device 1125, graphics controller 1140, and processor 1110 to display information such as text or images.

Circuit module 1145 may include a circuit module of a vehicle such as an automobile. Circuit module 1145 may receive information from other components to activate one or more subsystems of the vehicle. For example, circuit module 1145 may receive information that is processed by one or more of the image sensor device 1120, memory device 1125, and processor 1110, to activate one or more of an air bag system of a vehicle, a vehicle security alarm, and an obstacle alert system.

Memory device 1125 may include a volatile memory device, a non-volatile memory device, or a combination of both. For example, memory device 1125 may include a DRAM device, a static random access memory (SRAM) device, a flash memory device, or other memory devices, or a combination of these memory devices. In some embodiments, memory device 1125 includes a memory device (e.g., memory devices 100, 200, 400, and 1000) as described above with reference to FIG. 1 through FIG. 10.

The illustrations of apparatus such as memory devices 100, 200, 400, 1000, and 1125 and systems such as system 1100 are intended to provide a general understanding of the structure of various embodiments and not a complete description of all the elements and features of the apparatus and systems that might make use of the structures described herein. In the description above, signals noted as being in a high (high signal level or high state) or low (low signal level or low state) are described in that matter for purposes of illustration and not limitation. Other states, including opposite states, may be used.

The novel apparatus and systems of various embodiments may include or be included in electronic circuitry used in high-speed computers, communication and signal processing circuitry, single or multi-processor modules, single or multiple embedded processors, multi-core processors, data switches, and application-specific modules including multi-layer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

Figure 12:
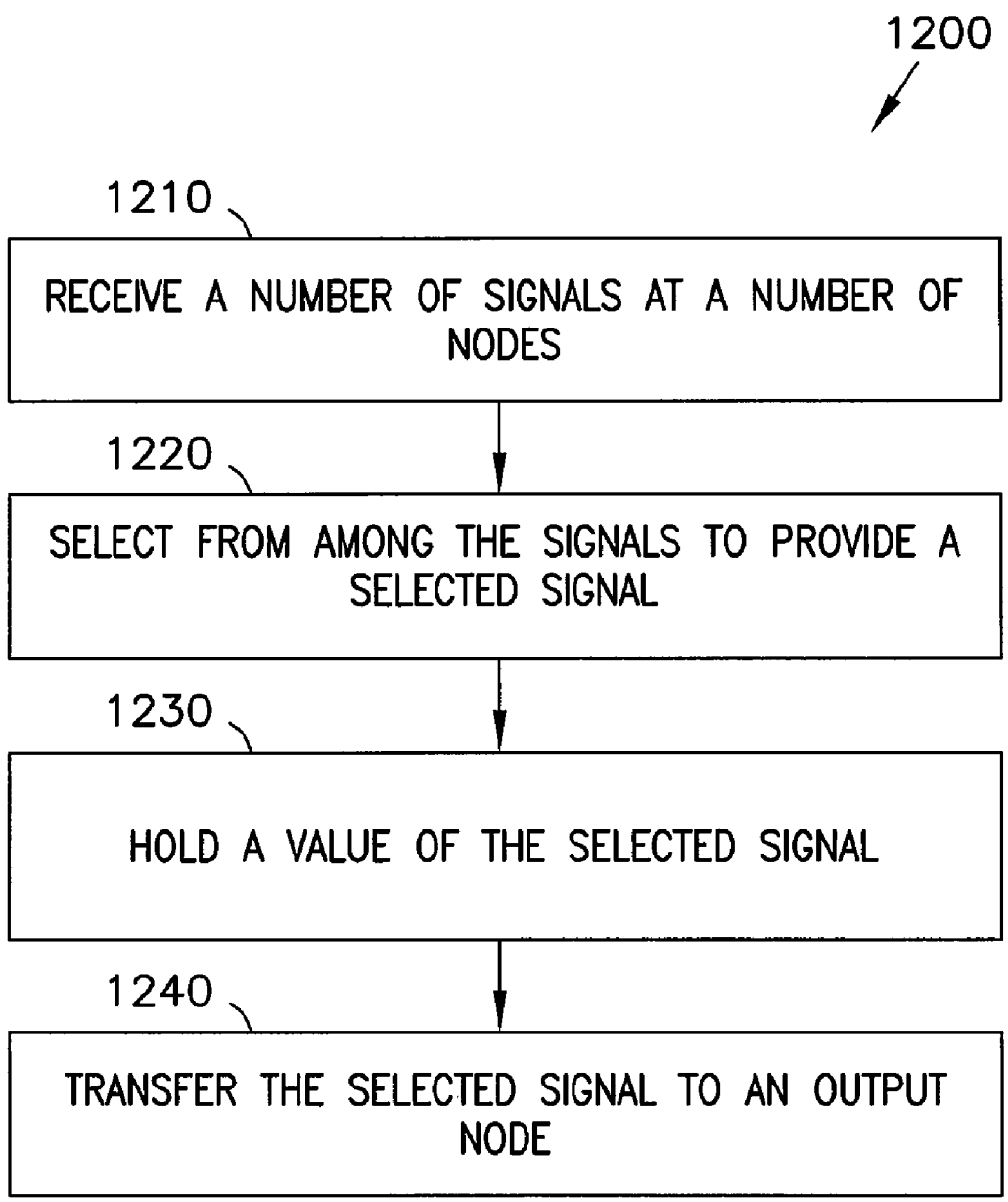
FIG. 12 is flow diagram showing a method according to an embodiment of the invention.

FIG. 12 is flow diagram showing a method 1200 according to an embodiment of the invention. Activity 1210 may include receiving a number of signals at a number of nodes (e.g., nodes 203 of FIG. 2 or nodes 403 of FIG. 4). The nodes may include internal nodes of a memory device. The memory device may include a number of transfer paths coupled to the nodes. The signals received at the nodes may represent information read from memory cells of the memory device. Activity 1220 may include selecting from among the signals received at the nodes to provide a selected signal. Activity 1230 may include holding a value of the selected signal. Activity 1240 may include transferring the selected signal to an output node (e.g., one of nodes 221, 222, 223, and 224 of FIG. 2 or one of nodes 421, 422, 423, and 424 of FIG. 4). The transfer paths used in method 1200 may include storage elements coupled between the nodes and the output node. Activity 1240, described above, may transfer the selected signal to the output node via one of the transfer paths. Activity 1230, described above, may hold the value of the selected signal in only one storage element of the storage elements before the selected signal is transferred to the output node.

The memory device used in method 1200 may include memory devices 100, 200, 400, 1000, and 1125, as described above with reference to FIG. 1 through FIG. 11. Thus, method 1200 may include one or more activities and operations of memory devices 100, 200, 400, 1000, and 1125.

The individual activities of method 1200 do not have to be performed in the order shown or in any particular order. Some activities may be repeated, and others may occur only once. Various embodiments may have more or fewer activities than those shown in FIG. 12.

CONCLUSION

One or more embodiments described herein include apparatus, systems, and methods comprising a number of nodes configured to receive a number of signals. The signals may represent information stored in a number of memory cells of a device such as a memory device. The device may include a number of transfer paths having storage elements coupled between the nodes and an output node. The transfer paths may be configured to transfer a selected signal of the signals from one of the nodes to the output node via one of the transfer paths. The transfer paths may be configured to hold a value of the selected signal in only one of the storage elements. Each of the transfer paths may include only one of the storage elements. Other embodiments including additional apparatus, systems, and methods are described above with reference to FIG. 1 through FIG. 12.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments of the invention is determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. An apparatus comprising:
a plurality of nodes configured to receive first signals and second signals, the first signals representing information stored in a plurality of memory cells, the second signals being complementary values of the first signals; and
a plurality of transfer paths including storage elements coupled between the plurality of nodes and an output node, each of the plurality of transfer paths including only one of the storage elements, the plurality of transfer paths configured to transfer a selected signal among the first signals and the second signals from one of the plurality of nodes to the output node via one of the plurality of transfer paths, wherein the plurality of transfer paths includes a transistor having a first terminal coupled to a first node included in the plurality of nodes and a second terminal coupled to a first node of a first storage element among the storage elements.

2. The apparatus of claim 1, wherein the first node of the first storage element is configured to receive a signal included in the first signals, and the first storage element includes a second node configured to receive a signal included in the second signals.

3. The apparatus of claim 2, wherein the selected signal is the signal received at the first node of the first storage element.

4. The apparatus of claim 1, wherein the transistor includes a gate configured to receive a signal and transfer one of the first and second signals from the plurality of nodes to the first node of the first storage element.

5. The apparatus of claim 4, wherein the plurality of transfer paths includes at least one transistor coupled between a second node included in the plurality of nodes and a second node of the first storage element.

6. The apparatus of claim 1, wherein the plurality of transfer paths is configured to hold a value of the selected signal in one of the plurality of storage elements before the selected signal is transferred to the output node.

7. The apparatus of claim 1, wherein a total number of the plurality of nodes is greater than a total number of the storage elements.

8. An apparatus comprising:
a plurality of input node pairs configured to receive a plurality of signal pairs, each of the signal pairs having different values, the plurality of input nodes pairs including a first input node pair; and
a plurality of transfer paths coupled between the plurality of input node pairs and an output node, each of the plurality of transfer paths including a storage element having a pair of input nodes to receive a signal pair included in the plurality of signal pairs, and an output circuit element to transfer a signal included in the signal pair from the storage element to the output node, wherein the plurality of transfer paths further includes a first transfer path having first transistor and a second transistor, a first node of the first transistor is coupled to a first input of the first input node pair, a second node of the first transistor is coupled to a first input of the pair of input nodes of the storage element of the first transfer path, a first node of the second transistor is coupled to a second input of the first input node pair, and a second node of the second transistor is coupled to a second input of the pair of input nodes of the storage element of the first transfer path.

9. The apparatus of claim 8, wherein the first transistor includes a gate to receive a signal to transfer a first signal of a first signal pair included in the plurality of signal pairs to the first input of the pair of input nodes of the storage element of the first transfer path, and the second transistor include a gate to receive the signal to transfer a second signal of the first signal pair included in the plurality of signal pairs to the second input of the pair of input nodes of the storage element of the first transfer path.

10. The apparatus of claim 9, wherein the transfer paths further include a second transfer path having a transistor pair coupled between a second pair of the plurality of input node pairs and the storage element of the second transfer path, wherein the first transistor pair of the first transfer path are configured to be responsive to a first signal, and the transistor pair of the second transfer path are configured to be responsive to a second signal.

11. The apparatus of claim 10, wherein the first and second transfer paths are configured to transfer the plurality of signal pairs to the storage element of the first transfer path and the storage element of the second transfer path in parallel, and wherein the first and second transfer paths are configured to serially transferred the plurality of signal pairs from the storage element of the first transfer path and the storage element of the second transfer path to the output node.

12. An apparatus comprising:
a plurality of input node pairs configured to receive a plurality of signal pairs, each of the signal pairs having different values; and
a plurality of transfer paths coupled between the plurality of input node pairs and an output node, each of the plurality of transfer paths including a storage element having a pair of input nodes to receive a signal pair included in the plurality of signal pairs, and an output circuit element to transfer a signal included in the signal pair from the storage element to the output node, wherein the transfer paths further include a first transfer path having first transistor pair coupled between a first pair of the plurality of input node pairs and the storage element of the first transfer path, and wherein the first transfer path further includes a second transistor pair coupled between the first pair of the plurality of input node pairs and the first transistor pair.

13. The apparatus of claim 12, wherein the first transistor pair and the second transistor pair are configured to be responsive to different signals.

14. The apparatus of claim 12, wherein the first transistor pair includes transistors of identical transistor type.

15. The apparatus of claim 14, wherein the second transistor pair includes transistors of identical transistor type.

16. A method comprising:
receiving signal pairs, each of the signal pairs having signals with different values;
transferring the signal pairs to storage elements, each of the storage elements including a pair of input nodes to receive one of the signal pairs; and
transferring a signal included in one of the signal pairs received at one of the storage elements to an output node, further comprising:
transferring the signal pairs through transistor pairs before transferring the signal pairs to the storage elements.

17. The method of claim 16, further comprising:
transferring the signal pairs through additional transistor pairs before transferring the signal pairs to the storage elements.

18. The method of claim 17, wherein the signal pairs are received in parallel at a plurality of nodes.

19. The method of claim 18, further comprising:
transferring a signal included in another one of the signal pairs received at another one of the storage elements to the output node.

* * * * *